United States Patent [19]

Di Carlo

[11] 4,356,457
[45] Oct. 26, 1982

[54] OPTIC FLOATING DECK MODULATOR

[75] Inventor: Edward F. Di Carlo, Baltimore, Md.

[73] Assignee: General Dynamics, Pomona Division, Pomona, Calif.

[21] Appl. No.: 183,519

[22] Filed: Sep. 2, 1980

[51] Int. Cl.³ .............................................. H03K 7/08
[52] U.S. Cl. ....................................... 332/3; 307/106; 332/9 T; 332/13; 375/71
[58] Field of Search ..................... 332/3, 9 R, 9 T, 13; 331/66, 79-84, 172, 173; 375/23, 71; 455/602, 608, 613, 600; 307/106; 250/551, 213 A

[56] References Cited

U.S. PATENT DOCUMENTS

| | | | |
|---|---|---|---|
| 2,217,869 | 10/1940 | Le Van | 331/66 X |
| 2,506,672 | 5/1950 | Kell et al. | 250/551 X |
| 3,202,905 | 8/1965 | Gomez | 250/551 X |
| 3,384,837 | 5/1968 | Toussaint | 332/3 |
| 3,449,619 | 6/1969 | Stalp | 315/10 |
| 3,497,616 | 2/1970 | McCown | 250/551 X |
| 3,524,986 | 8/1970 | Harnden, Jr. | 250/551 X |
| 3,593,180 | 7/1971 | Paine et al. | 331/10 |
| 3,629,590 | 12/1971 | Case | 250/208 |
| 3,810,034 | 5/1974 | Brunsch | 330/59 |
| 3,842,259 | 10/1974 | Bruning | 250/551 X |
| 3,943,367 | 3/1976 | Baker | 250/551 |
| 4,032,843 | 6/1977 | Loucks | 324/96 |
| 4,227,098 | 10/1980 | Brown et al. | 250/551 X |

Primary Examiner—Siegfried H. Grimm
Attorney, Agent, or Firm—Neil F. Martin; Michael H. Jester; Edward B. Johnson

[57] ABSTRACT

An optical floating deck modulator to modulate a control element of an electron device, such as the grid of a Klystron tube or traveling wave tube, having two high power MOSFET switching devices connected in series between a high positive and a high negative voltage source (which also supply the high voltage to the electron device) with the control element coupled between the MOSFET devices. This arrangement provides a low resistance path between the two voltage potentials and the control element being modulated, as the two MOSFET devices are switched alternately ON and OFF and thus achieves fast rise and fall times over a very high voltage swing. Each MOSFET device has a separate drive circuit (deck) and each deck comprises a photo diode information receiver coupled to a transimpedance amplifier, the output of which is amplified by a bipolar transistor amplifier and a FET amplifier. Total isolation between the decks and the information source is achieved by an optic link therebetween.

Also disclosed is an optic amplifier using one of the decks alone by connecting the FET amplifier of the deck to its own positive power supply. This amplifier uses a very small current when operating.

8 Claims, 4 Drawing Figures

OPTIC FLOATING DECK MODULATOR

BACKGROUND OF THE INVENTION

This invention relates, generally to apparatus for controlling the electron beam in a high voltage electron device and, more particularly, to an improved apparatus for modulating the control element of a high voltage device very fast between high positive and high negative voltages such as the tube control terminal (grid) of Klystron tube or traveling wave tube or the device can be used to operate as a switch drive for a switching power supply.

Klystron tubes and traveling wave tubes require high voltages for proper operation and it is desirable to apply a modulating signal to the control element (grid) of the tube which has a fast rise and fall time between the positive and negative high voltages the control element swings, preferably generated in a circuitry operating at a lower voltage level and which is completely isolated from the signal (information) source by a light path (optic link).

However, the prior art circuitry, while achieving optical isolation from an information signal source, was unable to achieve fast rise and fall times on the high voltage output signal because of the inherent capacitance of the devices used to modulate the control element between the high voltage negative and positive sources and the inherent high capacitance between the control element (grid) and the other elements (cathode) in the high power device (Klystron or TWTA). Thus switching was much slower and high current was utilized.

SUMMARY OF THE INVENTION

The apparatus which improves the foregoing prior art comprises, in one embodiment, an optical floating deck modulator to modulate a control element of an electron device, such as the grid of a Klystron tube or traveling wave tube, said modulator having two high power MOSFET switching devices connected in series between a high positive and a high negative voltage source (which also supply the high voltage to the electron device) with the control element coupled between the MOSFET devices. This arrangement provides a low resistance path to provide maximum current to overcome the inherent capacitance, between the two voltage potentials and the control element being modulated as the two MOSFET devices are switched alternately ON and OFF and thus achieves fast rise and fall times over a very high voltage swing. In the embodiment disclosed, each MOSFET device has a separate drive circuit (deck) and each deck comprises a photo diode information receiver coupled to a trans-impedance amplifier, the output of which is amplified by a bipolar transistor amplifier and an FET amplifier. Total isolation between the decks and the information source is achieved by an optic link therebetween.

The arrangement of the two decks in the modulator circuitry is such that the one deck floats with respect to the other. No external power supplies are required since the decks acquire power either from the MOSFET device they switch or from the tube power supply.

In another embodiment, one of the decks alone is used as an optic amplifier by connecting the FET amplifier of the deck to its own positive power supply and due to its configuration a very small current is used when operating.

Accordingly, it is one object of this invention to provide an optic floating deck modulator with fast rise and fall time high voltage swings for driving a device requiring high voltage modulation from an isolated signal or information source.

Still another object of this invention is to provide an optic amplifier which receives its signals via an optic link to drive an output device via a FET amplifier utilizing only a positive power supply with very little current drain.

DETAILED DESCRIPTION OF THE INVENTION

Figure 1:
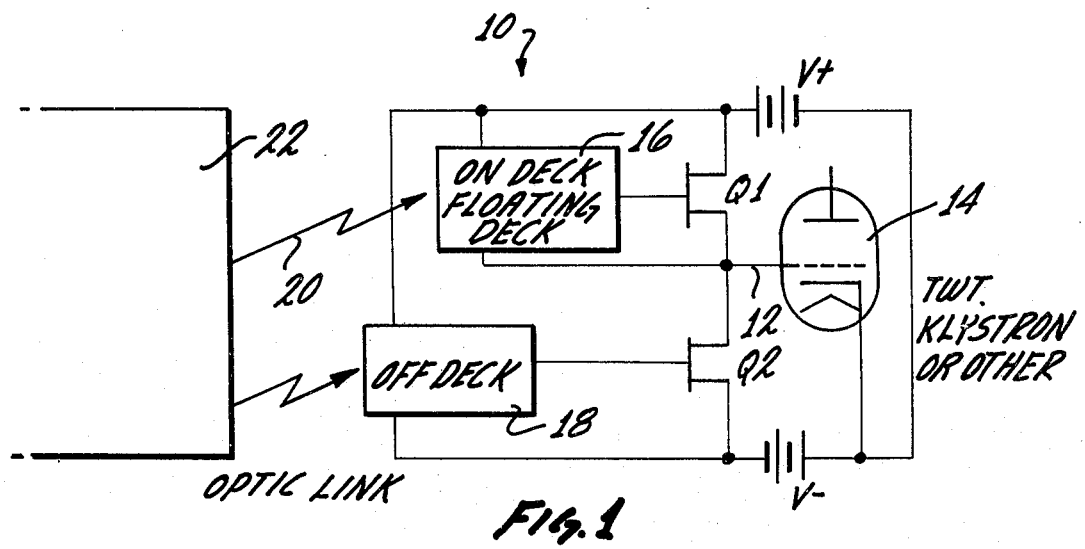
FIG. 1 is a block diagram of the optic floating deck modulator constructed in accordance with the teachings of this invention.

Turning now to FIG. 1, there is shown a modulator 10, constructed in accordance with the principles of the present invention, connected to an electrode 12 (grid) to control the operation of a tube 14, such as a Klystron tube or traveling wave tube, or any other device, by supplying a control signal to the control electrode 12.

In general, the modulator 10 comprises two high power MOSFET devices Q1 and Q2 connected in series between positive and negative DC voltage sources V+ and V− (batteries being shown) with the control element 12 connect between the two MOSFET devices. Each MOSFET device has a separate drive circuitry, or deck 16, 18, and arranged, as will be clear from a more detailed description hereinafter, so that one of the MOSFET devices is ON while the other is OFF to connect, respectively, the control element 12 to either of the voltage sources. (The switching from ON to OFF and vice versa, stated another way, is to switch from one state to a second state and vice versa.) Each drive circuitry is optically linked as at 20 to a signal or information source 22 for electronic isolation. The optic link 20 can be a fiber optic link, a glass rod, or any radiant energy transmission system through a medium such as air.

Figure 2:
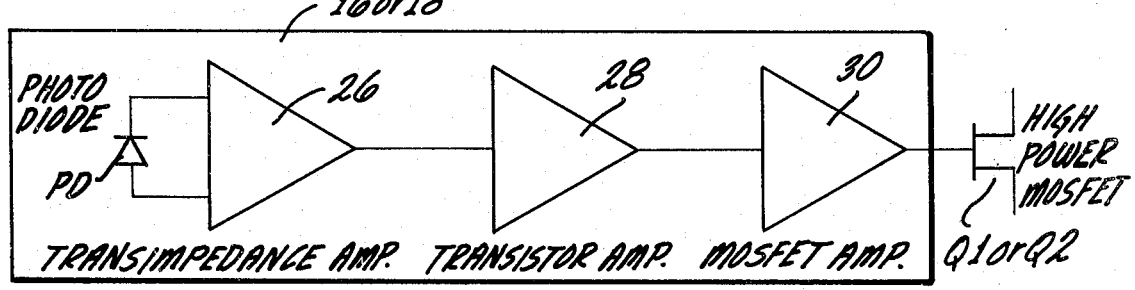
FIG. 2 is a deck circuit block diagram.

FIG. 2 illustrates one deck circuit block diagram 16 or 18 for one of the high power MOSFET devices, such as Q1 or Q2, which comprises a first photo diode PD as an information receiver coupled to a trans-impedance amplifier 26, which in turn is coupled to a transistor amplifier 28 and then to an FET amplifier 30. The FET amplifier 30 is connected to the gate terminal of the high power MOSFET device.

Figure 3:
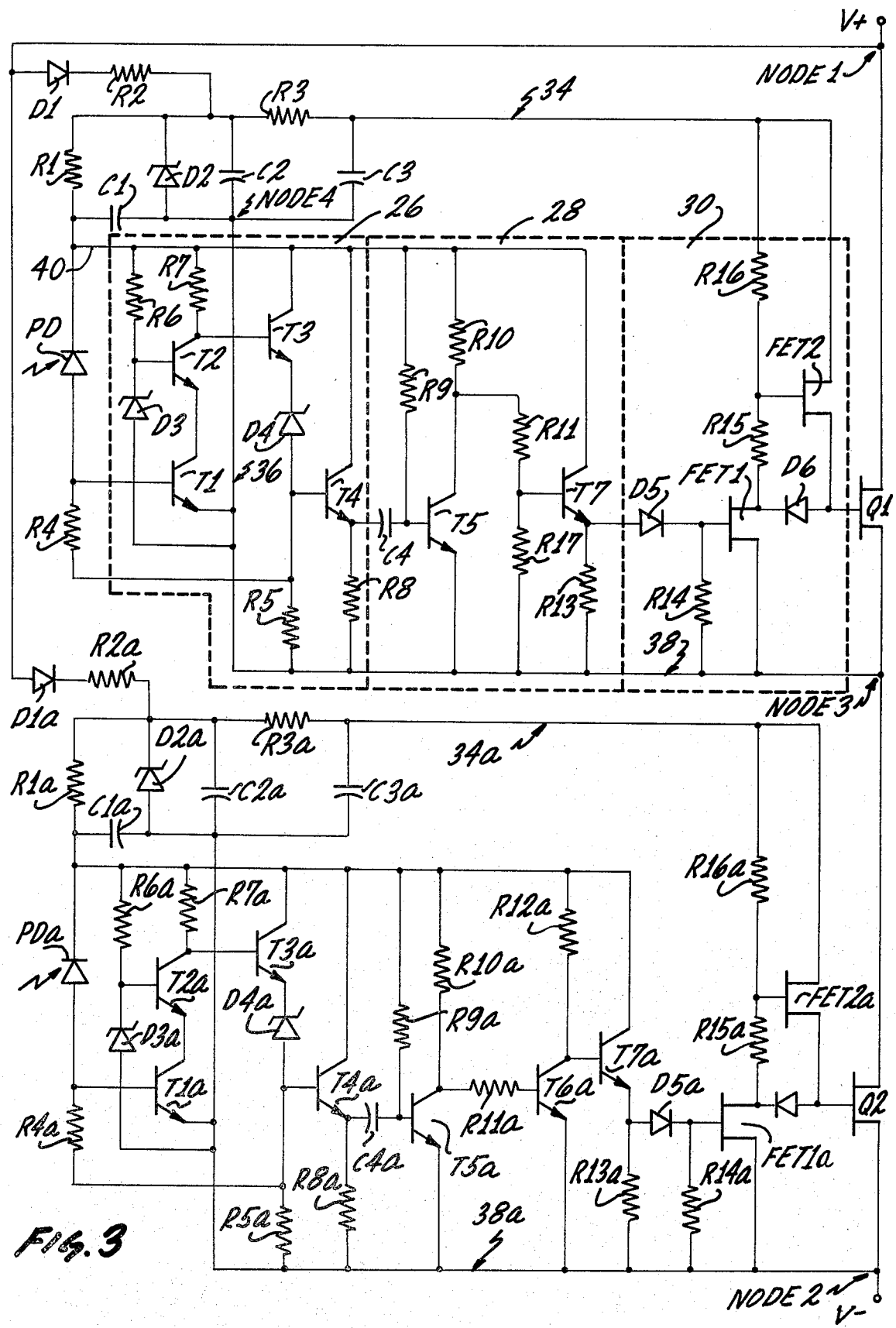
FIG. 3 is a schematic diagram of the modulator.

Turning now to FIG. 3 which illustrates schematically the circuitry illustrated by the block diagrams of FIGS. 1 and 2, it can be seen that the two high powered MOSFET devices Q1 and Q2 are connected in series between positive voltage source V+ at node 1 and a negative voltage source V− at node 2 with the control electrode coupled at node 3 between the two devices. The drain of MOSFET Q1 is connected to node 1 while its source is connected to output node 3 which, in turn, is coupled to the source electrode of MOSFET Q2 while the latter's drain is connected to node 2.

Before describing the circuitry in detail, it is to be noted, that the MOSFET device Q1 is connected to the output node 3, that its deck 16 derives its power between the drain and source of device Q1 and that deck 16 is thus considered "floating" with respect to the lower deck 18. Also, the decks do not have a separate power supply but derive their power from the tube high voltage power supply they are modulating.

Also, since the two decks are substantially the same, only deck 16 will be described herein with the difference between the two being pointed out after the more detailed description.

Again referring to FIG. 3, it can be seen that the information receiving photo diode PD has its cathode connected to resistance R1, resistance R6, and capacitor C1. Photodiode PD is connected via resistances R1 and R2 to the cathode of diode D1 whose anode, in turn, is connected to the positive power source V+. The cathode of diode PD is also coupled at node 4, via capacitor C1, to the anode of the first Zener diode D2 and the negative side of two capacitors C2 and C3, which, in turn, are connected in parallel to Zener diode D2 and resistance R1 but with a resistance R3 between the positive side of the two capacitors C2 and C3. The negative side of capacitor C2 is also connected by conductor lines 36 and 38 to the output node which is floating ground.

The trans-impedance amplifier 26 comprises four NPN transistors T1-T4. The base of transistor T1 is connected to the anode of a photo diode PD and its emitter is connected directly to the output node 3 via conductors 36 and 38. The base of transistor T1 is also connected to node 3 (floating ground) via resistances R4 and R5 and line 38. These latter resistances keep the voltage level at the base above floating ground. The collector of transistor T1 is connected to the emitter of transistor T2 whose base, in turn, is connected to the cathode of a Zener diode D3. Diode D3 is connected directly to node 3 (floating ground) via lines 36 and 38 and maintains the voltage level on the base of transistor T2 at 7 volts above ground. The base of transistor T2 is also connected to the cathode of photo diode PD via resistance R6 and line 40 and its collector is connected directly to the base of transistor T3 and to line 40 and photo diode PD via resistance R7. The collector of transistor T3 is, in turn, connected to conductor 40 and photo diode PD and its emitter is connected to the cathode of Zener diode D4. The anode of the latter diode is, in turn, connected to the base of transistor T4 and to line 38 via resistance R5. Transistor T4 has its collector connected to the conductor 40 and the cathode of the photo diode PD and its emitter connected to the output node 3 via resistance R8 and line 38. The emitter of transistor T4 is capacitively coupled via capacitor C4 to the base of NPN transistor T5 which is the first transistor of the bipolar transistor amplifier comprising NPN transistors T5 and T7. The base of transistor T5 is also connected to line 40 and the cathode of photo diode PD via resistance R9. The collector of this latter transistor is connected to line 40 and the cathode of photo diode PD via resistance R10 and its emitter is directly connected to the output node 3 via line 38. The collector of transistor T5 is also connected to the base of transistor T7 via a resistance R11 and to line 38 via resistance R17. The collector of transistor T7 is connected directly to line 40 and the photo diode PD and its emitter is connected to the output node 3 via resistance R13 and line 38. This latter emitter is also connected to the anode side of a diode D5 whose cathode is connected, first, to the output node 3 via a resistance R14 and line 38 and, secondly, to the gate of transistor FET 1. MOSFET transistor FET 1 is one of two MOSFET transistors FET 1 and FET 2 comprising the FET amplifier. The drain of the FET 1 is connected first via two resistances R15 and R16 to conductor 34 and to the positive voltage source of V+ via the diode D1 and resistances R2 and R3. The drain of transistor FET 1 is secondly connected to the cathode of diode D6 while the latter's anode is connected to the source of the second MOSFET transistor FET 2 and to the gate of the high powered MOSFET device Q1. The gate of MOSFET device FET 2 is connected between the two resistances R15 and R16 and its drain is also connected to the other end of resistance R16 and to line 34.

As can be seen, the second deck 18 is virtually the same as the first deck 16 and coupled to the positive voltage source V+ via diode D1a and resistance R1a with line 38a connected to the negative voltage source V−. Also, the equivalent resistance R17 has been omitted (with resistance R11a being of a different resistance value than its equivalent R11). Also, transistor T6 has been added in deck 18 since the two decks must deliver pulses of opposite polarity to their respective MOSFET devices Q1 and Q2. This will be clear when the operation of the above circuitry is explained in detail.

Also, those components in deck 18 performing same function as similar components in deck 16 are given the same identifying reference but with the suffix "a" to shorten the description of this invention.

In operation it is desirable that the voltage at output node 3 switch as fast as possible and the utilization of the high powered MOSFET devices Q1 and Q4 accomplish this purpose.

The operation of the circuitry will now be described.

First, it is to be noted that while deck 16 is considered the ON deck, were there a light failure in the information light source 22, deck 16 would go OFF and deck 18 would go ON with node 3 going to the negative voltage level V−. If the deck is connected as in FIG. 1, the grid of the Klystron or a TWT would go to the cathode voltage level. The reason for this is that a high voltage is applied to MOSFET Q2 while the voltage level applied to MOSFET Q1 is low. Secondly, it is the function of the diode D1 and resistances R2 and R1 to drop the voltage on line 40 to the working level for the collectors of the several transistors in the circuit. The function of diode D2, C1 and C3 circuitry arrangement is to filter the voltage to the remainder of the circuit, with capacitor C2 being connected directly to floating ground node 3 to keep a charge on MOSFET Q1, when MOSFET Q1 is ON.

When a light pulse is applied to the photo diode PD from light source 22, (which at the same time applies a light pulse to the photo diodes of the upper and lower decks) the base of the transistor T1, being low, receives a positive going pulse, due to the increase in current through photo diode PD, turning transistor T1 ON and pulling transistor T2 toward ground. Consequently, the collector of T2 and the base of transistor T3 receive a negative going pulse which causes transistor T3 to turn OFF and apply a negative going pulse to the base of transistor T4. At this time transistor T4 is also turned OFF, so that a positive going pulse will be applied to the base of transistor T5 through the AC coupling capacitor C4. The collector of transistor T5 then will have a negative going pulse through the inverting function of the collector which is applied through resistor R11 to the base of transistor T7 turning transistor T7 OFF. With transistor T7 connected in an emitter-follower relationship, the emitter of transistor T7 will have a negative going pulse. This negative going pulse is applied, through diode D5, to the gate of FET 1 which will turn FET 1 OFF with the result that its collector (drain) will have a positive going pulse. FET 2 will then have a positive going pulse applied to its gate, FET 2 is turned ON so that a positive going pulse is applied to the gate of MOSFET Q1 turning Q1 ON i.e., changing its state from a non-conductory state to a conductory state thus applying a full high positive voltage to node 3 pulling node 3 towards V+.

In the operation of the lower deck 18, the positive and negative going pulses of the circuitry are the same up to capacitor C4a. Thus, a positive going pulse is applied to the base of transistor T5a making the collector of transistor T5a have a negative going pulse. A negative going pulse is consequently applied to the base of transistor T6a with its collector also having a positive going pulse which is applied to the base of transistor T7a. (Note again that transistor T6a is in this circuit to provide the inversion function.) Transistor T7a is connected in an emitter-follower configuration, the emitter of T7a will have a positive pulse which is applied to the base of FET 1a. Consequently, the collector of transistor FET 1a has a negative going pulse, as the result of that there will be a negative going pulse at the gate of transistor FET 2a, turning FET 2a OFF, and as the result of that there will be a negative going pulse on the gate of MOSFET Q2 turning Q2 OFF, i.e. rendering Q2 non-conducting.

It is to be noted that by connecting the two MOSFET devices Q1 and Q2 in series a tail biting relationship exists to provide a fast fall time for the negative and positive swings on the control element. This tail biting relationship overcomes the residual capacitances which exist between the control (grid) and the other elements (cathode) of the high power devices (Kystron TWTA).

Figure 4:
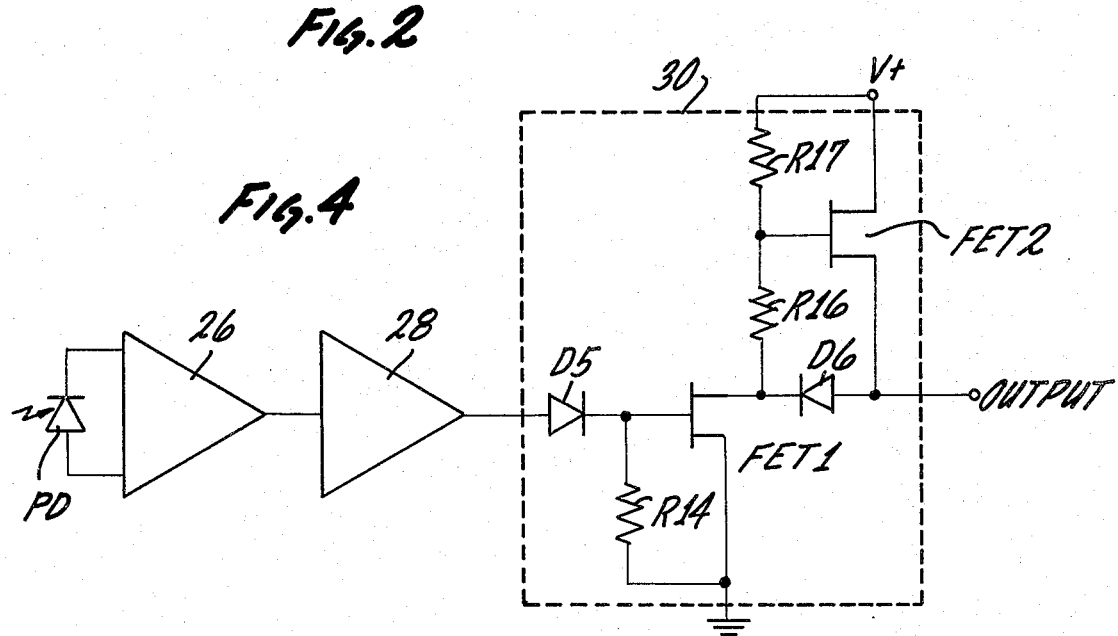
FIG. 4 is a partly block, partly schematic, diagram of an optic amplifier embodying the principles of this invention.

Turning now to the configuration of FIG. 4, it can be seen that the circuitry is identical in its operation and function as that of the top deck except that the high powered MOSFET Q1 has been omitted and the FET amplifier has been connected directly to the positive voltage supply. The FET amplifier in this case provides a high bandwidth optically coupled amplifier. Also, only one positive voltage source is needed which is not found in the prior art optic type amplifiers.

In a practical embodiment of this invention, MOSFET devices Q1 and Q2 are VN45JA made by Siliconix and FET 1 and FET 2 are 2N6661 also made by Siliconix. Equivalent devices made by International Rectifier were also tried and found to be equally satisfactory. The voltage at V+ is +200 volts, at V− is −200 volts with line 34 operating at +15 volts and line 40 at +15 volts. The switch voltage level in the optic amplifier of the FIG. 4 is between 0.0 volts and +40 volts. It is to be understood that the value of the resistances and capacitances and the type of other components selected will vary depending upon the voltage swings required by the driven devices.

From the foregoing it can be seen that there is disclosed a modulator that allows switching of 400 volts positive to negative in less than 50 nanoseconds utilizing optic isolation. It will be apparent to those skilled in the art that such a modulator greatly decreases the size, weight and complexity of optic modulators used presently. Also it is apparent this invention can also be used as a switch drive for a switching power supply thus eliminating transformers and enabling the power supply to switch at speeds much higher than presently achieved.

What is claimed is:

1. An optic floating deck modulator for modulating a control element of an electron device in response to light pulses as information signals sent from a light source, said electron device having positive and negative DC voltage sources for operating said electron device, comprising:

a pair of high power switching devices connected in series between said positive and negative voltage sources, the control element of said electron device being coupled between said switching devices to receive a positive voltage pulse and a negative voltage pulse as said switching devices are changed alternately from a first state to a second state, means for changing said switching devices from said first state to said second state comprising a pair of decks connected one to each switching device, one of said decks being connected between the positive voltage source and said control element and the other deck being connected between the positive voltage source and the negative voltage source, each of said decks including, light sensitive means for receiving light pulses from said light source and producing an electrical variation in response thereto, and means for amplifying said electrical variation and applying same to the high power switching device to which it is connected.

2. The modulator as claimed in claim 1 wherein said high power switching devices are first and second MOSFET devices, said first device having its drain connected to said positive DC voltage source, its source connected to said control element and its gate connected to one of said means for amplifying said electrical variation, and the second MOSFET device having its source connected to said control element and to the source of said first device, its gate connected to the other one of said means for amplifying said electrical variations, and its drain connected to said negative DC voltage source.

3. The modulator as claimed in claim 2 wherein said means for amplifying said electrical variations comprises a trans-impedance amplifier, a transistor amplifier, and a FET amplifier, said amplifiers being cascaded.

4. The modulator as claimed in claim 3 wherein said trans-impedance amplifier comprises four NPN transistors each having a base, a collector and an emitter, the base of the first transistor being connected to said light sensitive means with its emitter connected to ground and its collector connected to the emitter of the second transistor whose base is biased at a selected voltage and whose collector is connected to the base of the third transistor and to a second positive voltage source, the collector of said third transistor is connected to said second voltage source and its emitter is clamped at a selected voltage and connected to the base of the fourth transistor whose collector is connected to said second positive voltage source and whose emitter is connected to ground and forms the output of the trans-impedance amplifier.

5. The modulator as claimed in claim 4 wherein said transistor amplifier comprises fifth and sixth NPN transistors each having a base, an emitter and a collector,
the base of said fifth transistor being AC coupled to the output of said trans-impedance amplifier with its emitter connected directly to ground while its collector is connected to the base of the sixth transistor,
the collector of said sixth transistor is connected to said second positive voltage source and its emitter comprises the output of said transistor amplifier.

6. The modulator as claimed in claim 5 wherein one of said transistor amplifiers includes an additional NPN transistor having a base, an emitter and a collector and coupled between said first and second transistor of said transistor amplifier to provide an inverted output from said transistor amplifier.

7. The modulator as claimed in claim 6 wherein said FET amplifier comprises a pair of FET devices each having a gate, a source and a drain with the gate of one of said FET devices being coupled to the output of said transistor amplifier and with its source connected directly to ground and its drain connected to the gate of the second FET device and to a third DC voltage source different from said first mentioned DC voltage source and said second DC voltage source and coupled via a diode to the source of said second FET device with the drain of said second FET device being connected directly to said third DC voltage source while its source is connected directly to the gate of said MOSFET device.

8. An optic amplifier for driving an electron device in response to light pulses as information signals sent from a light source, comprising:
a positive DC voltage source,
a light sensitive device for receiving light pulses from said light source and producing an electrical variation in response thereto, and
means for amplifying said electrical variation and applying same to the electron device to which it is connected,
said means for amplifying said electrical variations comprises a trans-impedance amplifier, a transistor amplifier, and a FET amplifier, said amplifiers being connected in series, with said FET amplifier being connected between said positive voltage source and ground.

* * * * *